(12) United States Patent
Kang et al.

(10) Patent No.: US 9,986,336 B2
(45) Date of Patent: May 29, 2018

(54) HEADPHONE DRIVER, A SOUND SYSTEM THAT INCORPORATES THE HEADPHONE DRIVER AND A COMPUTING SYSTEM THAT INCORPORATES THE HEADPHONE DRIVER

(71) Applicant: SAMSUNG ELECTRONICS CO., LTD., Suwon-si, Gyeonggi-do (KR)

(72) Inventors: Sang Hyub Kang, Yongin-si (KR); Sun Woo Kwon, Seongnam-si (KR); Hyun Sun Shim, Yongin-si (KR); Myung Jin Lee, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days. days.

(21) Appl. No.: 15/332,275

(22) Filed: Oct. 24, 2016

(65) Prior Publication Data

US 2017/0201827 A1 Jul. 13, 2017

(30) Foreign Application Priority Data

Jan. 8, 2016 (KR) .................. 10-2016-0002400

(51) Int. Cl.
| | |
|---|---|
| *H04R 3/12* | (2006.01) |
| *H03F 3/45* | (2006.01) |
| *H03G 1/00* | (2006.01) |
| *H03H 7/075* | (2006.01) |
| *H04R 5/04* | (2006.01) |
| *H03F 3/183* | (2006.01) |

(Continued)

(52) U.S. Cl.
CPC .............. *H04R 3/12* (2013.01); *H03F 3/183* (2013.01); *H03F 3/187* (2013.01); *H03F 3/45475* (2013.01); *H03G 1/0035* (2013.01); *H03H 7/075* (2013.01); *H03H 7/24* (2013.01); *H04R 1/1083* (2013.01); *H03F 2200/156* (2013.01); *H03F 2200/211* (2013.01); *H03F 2200/252* (2013.01); *H03F 2203/45528* (2013.01); *H03F 2203/45534* (2013.01); *H03F 2203/45604* (2013.01); *H03F 2203/45616* (2013.01); *H04R 5/04* (2013.01)

(58) Field of Classification Search
CPC .. H04R 3/12; H04R 5/04; H03F 3/183; H03F 3/45475; H03F 2200/156; H03F 2200/252; H03G 1/0035; H03H 7/075
See application file for complete search history.

(56) References Cited

U.S. PATENT DOCUMENTS 6,127,893 A 10/2000 Llewellyn et al.
6,819,768 B1 11/2004 Sculley
(Continued)

*Primary Examiner* — Brenda C Bernardi
(74) *Attorney, Agent, or Firm* — Volentine, Whitt & Francos, PLLC

(57) ABSTRACT

A headphone driver, a sound processor that incorporates the headphone driver and a computing system that incorporates the headphone driver, wherein the headphone driver includes an amplifier having an input terminal and an output terminal, an R-2R ladder network provided with an input signal and connected to the input terminal of the amplifier, and a feedback resistor group connected to the input terminal and to the output terminal of the amplifier. The R-2R ladder network includes a plurality of resistor branches and a first attenuator that is connected between the plurality of resistor branches.

17 Claims, 13 Drawing Sheets

(51) Int. Cl.
*H03F 3/187* (2006.01)
*H03H 7/24* (2006.01)
*H04R 1/10* (2006.01)

(56) References Cited

U.S. PATENT DOCUMENTS

| | | |
|---|---|---|
| 7,162,029 B2 | 1/2007 | Soman et al. |
| 7,298,855 B2 | 11/2007 | Tsuji et al. |
| 8,036,402 B2 | 10/2011 | Furge |
| 8,195,117 B2 | 6/2012 | Bult et al. |
| 8,421,662 B2 * | 4/2013 | Kon ................. H03M 1/687 341/145 |
| 8,896,472 B2 * | 11/2014 | Seo ................. H03M 1/785 341/144 |
| 9,178,524 B1 * | 11/2015 | Lee ................. H03M 1/0612 |

\* cited by examiner

1200

1300

1400

HEADPHONE DRIVER, A SOUND SYSTEM THAT INCORPORATES THE HEADPHONE DRIVER AND A COMPUTING SYSTEM THAT INCORPORATES THE HEADPHONE DRIVER

PRIORITY STATEMENT

This application claims priority to Korean Patent Application No. 10-2016-0002400 filed on Jan. 8, 2016 in the Korean Intellectual Property Office, the disclosure of which is hereby incorporated by reference herein in its entirety.

BACKGROUND

1. Technical Field

The present disclosure relates to a headphone driver, a sound system that incorporates the headphone driver and a computing system that incorporates the headphone driver.

2. Description of the Related Art

The demand for high-quality audio reproduction for electronic devices such as smartphones or tablet personal computers (PCs) has steadily increased. To meet this demand, audio circuits are required to have excellent sound-to-noise ratio (SNR) properties.

To configure circuitry having an excellent SNR, impedance of a resistor of a feedback loop of an amplifier may be lowered. Lowering the impedance of the resistor, however, may be unfavorable as it may increase power consumption of the electronic device that incorporates the circuitry.

Also, at the time of the initiation of audio playback, noise may be generated at a speaker or a headphone connected to the electronic device due to a rapid increase in the gain of the amplifier in connection with the driving of the amplifier. This noise is referred to as pop noise, and it is desirable to reduce pop noise in order to improve a user's audio playback experience.

SUMMARY

A headphone driver, a sound processor that incorporates the headphone driver and a computing system that incorporates the headphone driver are provided. The headphone driver comprises an amplifier, an R-2R ladder network, a first resistive group, and an attenuator. The amplifier includes at least a first input terminal and an output terminal. The R-2R ladder network is connected to the input terminal of the amplifier and comprises a plurality of interconnected resistor branches. Each resistor branch comprises a pair of first and second resistors. The feedback resistor group is connected to the first input terminal and to the output terminal of the amplifier. The first attenuator is connected between first and second resistor branches of said plurality of resistor branches.

The sound processor comprises a digital-to-analog converter (DAC) and a headphone driver. The DAC receives digital signals and converts the digital signals into analog control signals, which are output from the DAC. The headphone driver includes an amplifier, an R-2R ladder network and a feedback resistor group. The amplifier has at least a first input terminal and an output terminal. The R-2R ladder network is connected to the first input terminal of the amplifier. The feedback resistor group is connected to the first input terminal and to the output terminal of the amplifier. The R-2R ladder network includes a first resistor branch that receives an analog input signal output from the DAC and outputs a first current, a second resistor branch connected to the first resistor branch, and a first attenuator connected in parallel between the first and second resistor branches. The first attenuator outputs part of the first current to a ground in response to analog control signals received by the headphone driver from the DAC.

The computing system comprises a central processing unit (CPU), an input device and a sound processor. The CPU is configured to control the sound processor. The input device, which is in communication with the CPU, is configured to receive input from a user of the computing system and to convert the user input into commands to be processed by the CPU. The CPU receives the commands and outputs digital control signals according to the commands. The sound processor, which is in communication with the CPU, comprises a DAC and a headphone driver. The DAC receives the digital control signals output from the CPU and converts the digital signals into analog control signals, which are output from the DAC. The headphone driver includes an amplifier, an R-2R ladder network, and a feedback resistor group. The amplifier has at least a first input terminal and an output terminal. The R-2R ladder network is connected to the first input terminal of the amplifier. The feedback resistor group is connected to the first input terminal and to the output terminal of the amplifier. The R-2R ladder network includes a first resistor branch that receives an analog input signal output from the DAC and outputs a first current, a second resistor branch connected to the first resistor branch, and a first attenuator connected in parallel between the first and second resistor branches. The first attenuator outputs part of the first current to a ground in response to analog control signals received by the headphone driver from the DAC.

These and other features and aspects will be apparent from the following detailed description, drawings, and claims.

DETAILED DESCRIPTION OF THE EMBODIMENTS

Figure 1:
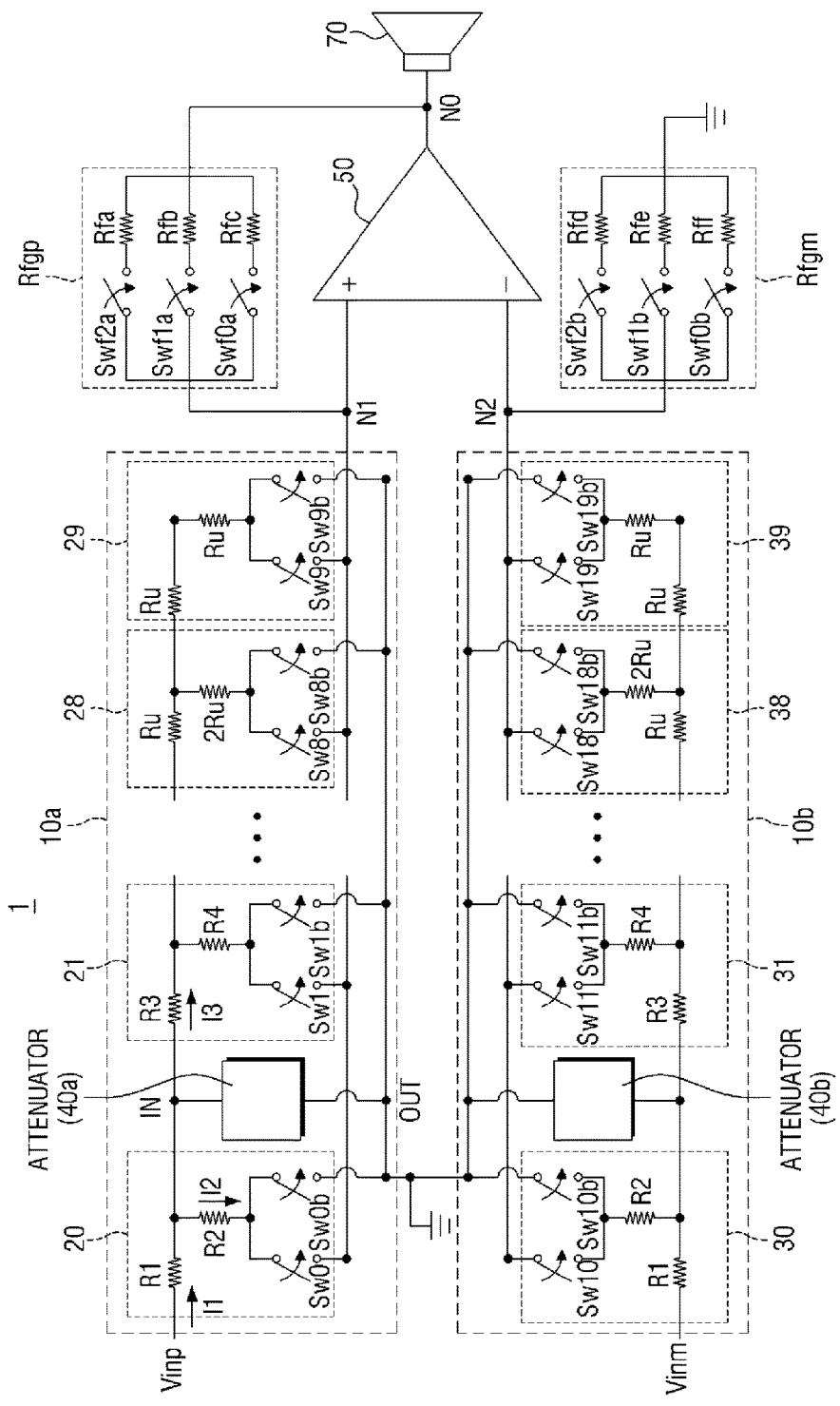
FIG. 1 is a schematic circuit diagram of a headphone driver according to an exemplary embodiment of the present disclosure.

Advantages and features of the inventive concepts may be understood more readily by reference to the following detailed description of exemplary, or illustrative, embodiments and the accompanying drawings. The present disclosure may, however, be embodied in many different provides and should not be construed as being limited to the embodiments set forth herein. Rather, these embodiments are provided to demonstrate the inventive principles and concepts. Like reference numerals in the figures refer to like elements, features or components throughout the specification.

In the following detailed description, for purposes of explanation and not limitation, example embodiments disclosing specific details are set forth in order to provide a thorough understanding of an embodiment according to the inventive principles and concepts. However, it will be apparent to one having ordinary skill in the art having the benefit of the present disclosure that other embodiments according to the present disclosure that depart from the specific details disclosed herein remain within the scope of the appended claims. Moreover, descriptions of well-known devices, elements or components may be omitted so as to not obscure the description of the example embodiments. Such devices, elements or components are clearly within the scope of the present disclosure. It should also be understood that the word "example," as used herein, is intended to be non-exclusionary and non-limiting in nature. More particularly, the word "exemplary" as used herein indicates one among several examples, and it must be understood that no undue emphasis or preference is being directed to the particular example being described.

The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It should be noted that when an element or component is referred to herein as being "connected to" or "coupled to" or "electrically coupled to" another element or component, it can be directly connected or coupled, or intervening elements may be present.

FIG. 1 is a schematic circuit diagram of a headphone driver according to an exemplary embodiment of the present disclosure. A headphone driver 1 may include R-2R ladder networks (10a and 10b), feedback resistors (Rfgp and Rfgm) and an amplifier 50. The amplifier 50 includes input terminals N1 and N2 and an output terminal NO. The amplifier 50 receives input signals via the input terminals N1 and N2 and provides output signals via the output terminal NO. In accordance with an embodiment, the amplifier 50 comprises an operational amplifier, although the inventive concepts are not limited to any particular type of amplifier being used for this purpose. The amplifier 50 may include one or more operational amplifiers. For example, the amplifier 50 may include a preamplifier and a main amplifier, and the main amplifier may amplify output signals from the preamplifier. In some exemplary embodiments, the amplifier 50 is a three-stage amplifier. In the description that follows, it is assumed that the amplifier 50 is an operational amplifier having two input terminals and one output terminal.

The R-2R ladder networks (10a and 10b) receive input voltages Vinp and Vinm, generate output currents, and output the output currents to the input terminals N1 and N2 or to a ground. The R-2R ladder networks (10a and 10b) may receive current signals as input signals. The R-2R ladder networks (10a and 10b) may include a first R-2R ladder network 10a and a second R-2R ladder network 10b. As illustrated in FIG. 1, the first R-2R ladder network 10a is connected to a non-inverting input terminal N1 of the amplifier 50, and the second R-2R ladder network 10b is connected to an inverting input terminal N2 of the amplifier 50. The first and second R-2R ladder networks 10a and 10b receive the input voltages Vinp and Vinm, respectively, which are differential input signals. The first and second R-2R ladder networks 10a and 10b may be almost identical except for the signals that they receive and output. Therefore, in the interest of brevity, only the first R-2R ladder network 10a will be described in detail.

The first R-2R ladder network 10a may include a plurality of resistor branches 20 through 29 and a first attenuator 40a. For exemplary or illustrative purposes, the first R-2R ladder network 10a is assumed to have first through tenth resistor branches 20 through 29, respectively. It should be noted that the headphone driver 1 is not limited with respect to the number of resistor branches that each R-2R ladder network 10a and 10b has. That is, each R-2R ladder network 10a and 10b has two or more resistor branches. As the number of resistor branches in each R-2R ladder network 10a and 10b of the headphone driver 1 increases, the range, or granularity, of control of the gain of the headphone driver 1 also increases.

The first resistor branch 20 includes a first resistor R1 that receives the input voltage Vinp and has a first resistance, Ru, a second resistor R2 that has a second resistance, 2 Ru, that is two times greater than the first resistance Ru, and switches Sw0 and Sw0b. The second resistor R2 is connected to the switches Sw0 and Sw0b. The first resistance Ru may be, for example, 150 Ω.

A feedback resistor group Rfgp of the headphone driver 1 is connected to the input terminal N1 and to the output terminal NO of the amplifier 50. If all of the switches of the first R-2R ladder network 10a that are connected to the input terminal N1 of the amplifier 50, i.e., switches Sw0 through Sw9, are closed and there is the need to set the gain of the headphone driver 1 to 0 dB, the feedback resistor group Rfgp will have the second resistance of 2 Ru.

In the headphone driver 1 and in systems that incorporate the headphone driver 1, SNR properties are improved by suppressing noise of the headphone driver 1. The noise of the headphone driver 1 may include thermal noise. Thermal noise generated by the feedback resistor group Rfgp of the headphone driver 1 is generally proportional to the resistance of the feedback resistor group Rfgp. In a case in which the gain of the headphone driver 1 is set to 0 dB, configuring the feedback resistor group Rfgp to have a resistance of about 300 Ω provides acceptable SNR properties. Accordingly, in such cases a suitable first resistance Ru is typically around 150 Ω. However, the first resistance Ru of 150 Ω is exemplary, and the present disclosure is not limited thereto. The selection of a suitable first resistance Ru may depend on other factors, as will be understood by those of skill in the art in view of the description being provided herein.

One terminal of the second resistor R2 is connected to the first resistor R1 and to the attenuator 40, and the other terminal of the second resistor R2 is connected to the first and second switches Sw0 and Sw0b.

The first and second switches Sw0 and Sw0b may be complementarily opened and closed. That is, in a case in which the first switch Sw0 is closed, the second switch Sw0b is opened, and thus the second resistor R2 is connected to the input terminal N1 of the amplifier 50. On the other hand, in a case in which the second switch Sw0b is closed, the first switch Sw0 is opened, and thus, the second resistor R2 is connected to ground. Accordingly, in a case in which the first switch Sw0 is closed, a second current I2 flowing in the second resistor R2 is provided to the amplifier 50, and in a case in which the second switch Sw0b is closed, the second current I2 flows to the ground.

The first and second R-2R ladder networks 10a and 10b control the amount of current flowing to the input terminals N1 and N2, respectively, of the amplifier 50 according to whether the switches Sw0 through Sw19b are opened or closed. The current control and the gain control of the first and second R-2R ladder networks 10a and 10b will be described below in detail.

The second resistor branch 21 typically has a structure that is similar or identical to the structure of the first resistor branch 20. That is, the second resistor branch 21 includes a third resistor R3 that has the first resistance Ru, a fourth resistor R4 that has the second resistance 2 Ru, and switches Sw1 and Sw1b connected to the fourth resistor R4. The second resistor branch 21 receives a third current I3 and generates and outputs an output current to the input terminal N1 of the amplifier 50 or to ground depending on whether the switches Sw1 and Sw1b, which operate complementarily, are opened or closed.

In accordance with this illustrative embodiment, the first R-2R ladder network 10a includes the third through ninth resistor branches 22 through 28, respectively, having structures that are similar or identical to the first and second resistor branches 20 and 21, respectively. Therefore, in the interest of brevity, detailed descriptions of the third through ninth resistor branches 22 through 28, respectively, are omitted.

A tenth resistor branch 29 of the first R-2R ladder network 10a is connected to the ninth resistor branch 28. The tenth resistor branch 29 has a structure that is similar or identical to the ninth resistor branch 28 except that it includes two resistors that both have the first resistance Ru and that are connected in series to each other.

The first feedback resistor group Rfgp is connected to the output terminal NO and to the input terminal N1 of the amplifier 50. In accordance with this illustrative embodiment, the first feedback resistor group Rfgp includes three resistors Rfa, Rfb, and Rfc and three switches Swf0a, Swf1a, and Swf2a, which control the three resistors Rfa, Rfb, and Rfc, respectively. In some exemplary embodiments, the resistance of the three resistors Rfa, Rfb, and Rfc may be n or 1/n times greater than the first resistance Ru, where n is a natural number that is greater than or equal to one. More specifically, the resistance of the three resistors Rfa, Rfb, and Rfc may be 4, 2, or 1/20 times greater than the first resistance Ru.

A headphone output terminal 70 is connected to the output terminal NO of the amplifier 50 and converts an amplified signal output from the amplifier 50 into an audio signal. Although not specifically illustrated, the headphone output terminal 70 may also be connected to ground.

Figure 2:
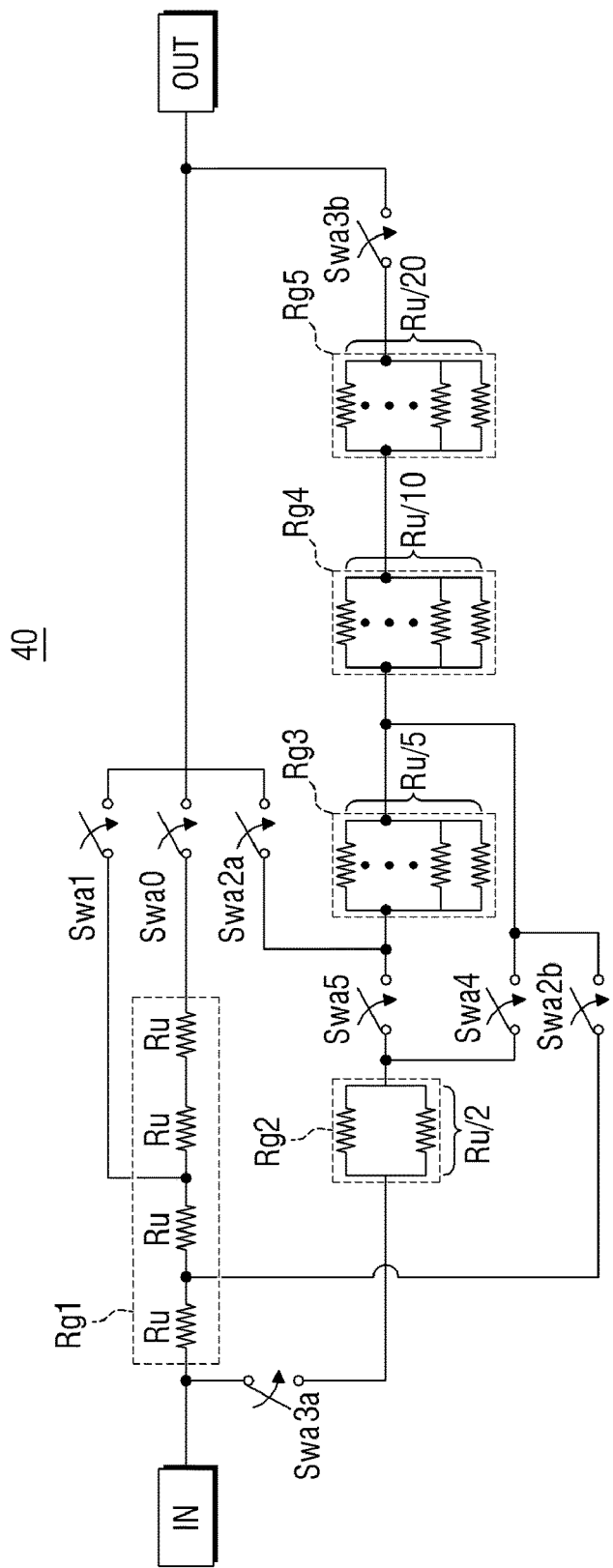
FIG. 2 is a schematic circuit diagram of an exemplary attenuator of the headphone driver of FIG. 1.

FIG. 2 is a schematic diagram of an attenuator 40 of the headphone driver 1 shown in FIG. 1 in accordance with an illustrative embodiment. In accordance with an embodiment, the attenuators 40a and 40b shown in FIG. 1 have the configuration of the attenuator 40 shown in FIG. 2.

Referring to FIGS. 1 and 2, the attenuator 40 includes a first resistor group Rg1, which includes a plurality of resistors that have the first resistance Ru and are connected in series, second through fifth resistor groups Rg2 through Rg5, respectively, which each include a plurality of resistors that have the first resistance Ru and are connected in parallel, and internal switches Swa0, Swa1, Swa2a, Swa2b, Swa3a, Swa3b, Swa4 and Swa5 that are connected to the first through fifth resistor groups Rg1 through Rg5.

The internal switches Swa0 through Swa5 are opened or closed according to separate control signals. The third internal switches Swa2a and Swa2b are opened or closed according to the same control signal. The fourth internal switches Swa3a and Swa3b are opened or closed according to the same control signal.

The second, third, fourth, and fifth resistor groups Rg2 through Rg5, respectively, include two resistors, five resistors, ten resistors, and twenty resistors, respectively, and the resistors of each of the second, third, fourth, and fifth resistor groups Rg2 through Rg5, respectively, have the first resistance Ru and are connected in parallel. That is, the combined resistances of the second, third, fourth, and fifth resistor groups Rg2 through Rg5, respectively, are ½ times, ⅕ times, 1/10 times, and 1/20 times, respectively, greater than the first resistance Ru. In accordance with this exemplary embodiment, this resistor configuration of the attenuator 40 is used to control the gain of the headphone driver 1 in increments of 1 dB. To control the gain of the headphone driver 1 in increments of other than 1 dB, a different resistor configuration from that of the attenuator 40 shown in FIG. 2 will be used with the headphone driver 1.

The resistors that are included in the attenuator 40 may be identical, having the first resistance Ru. The attenuator 40 has an internal resistor made up of the resistors connected in series and/or in parallel, depending on the opened/closed positions of the switches Swa0 through Swa5, to provide various resistances to thereby control the gain of the headphone driver 1 in increments of 1 dB. In some embodiments, the internal resistor is configured by connecting a plurality of the resistors having the first resistance Ru in parallel. Accordingly, the likelihood of a gain imbalance due to mismatches between resistors having various resistances is reduced.

Figure 3A:
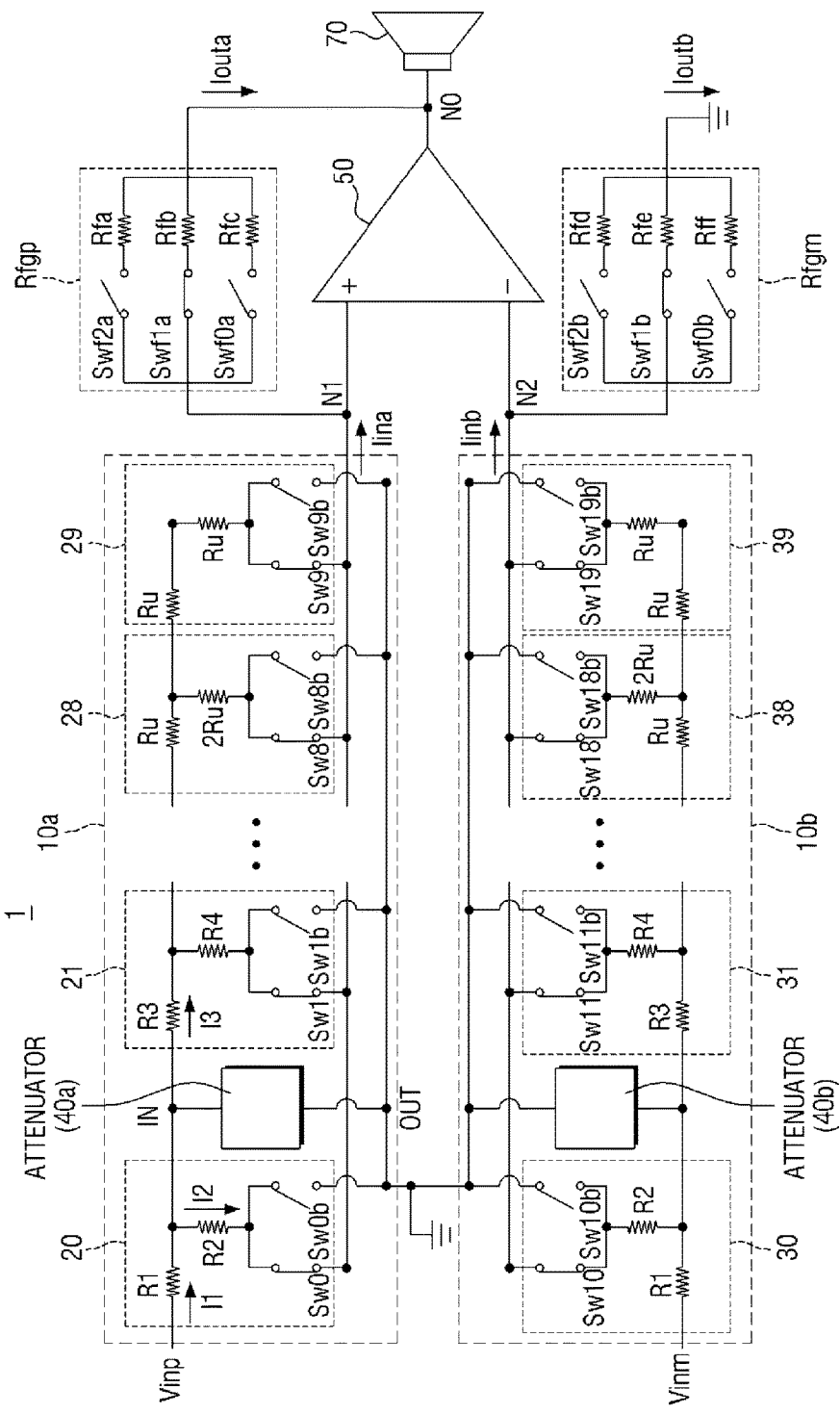
FIGS. 3A and 3B are schematic circuit diagrams for explaining the operation of the headphone driver of FIG. 1.
Figure 3B:
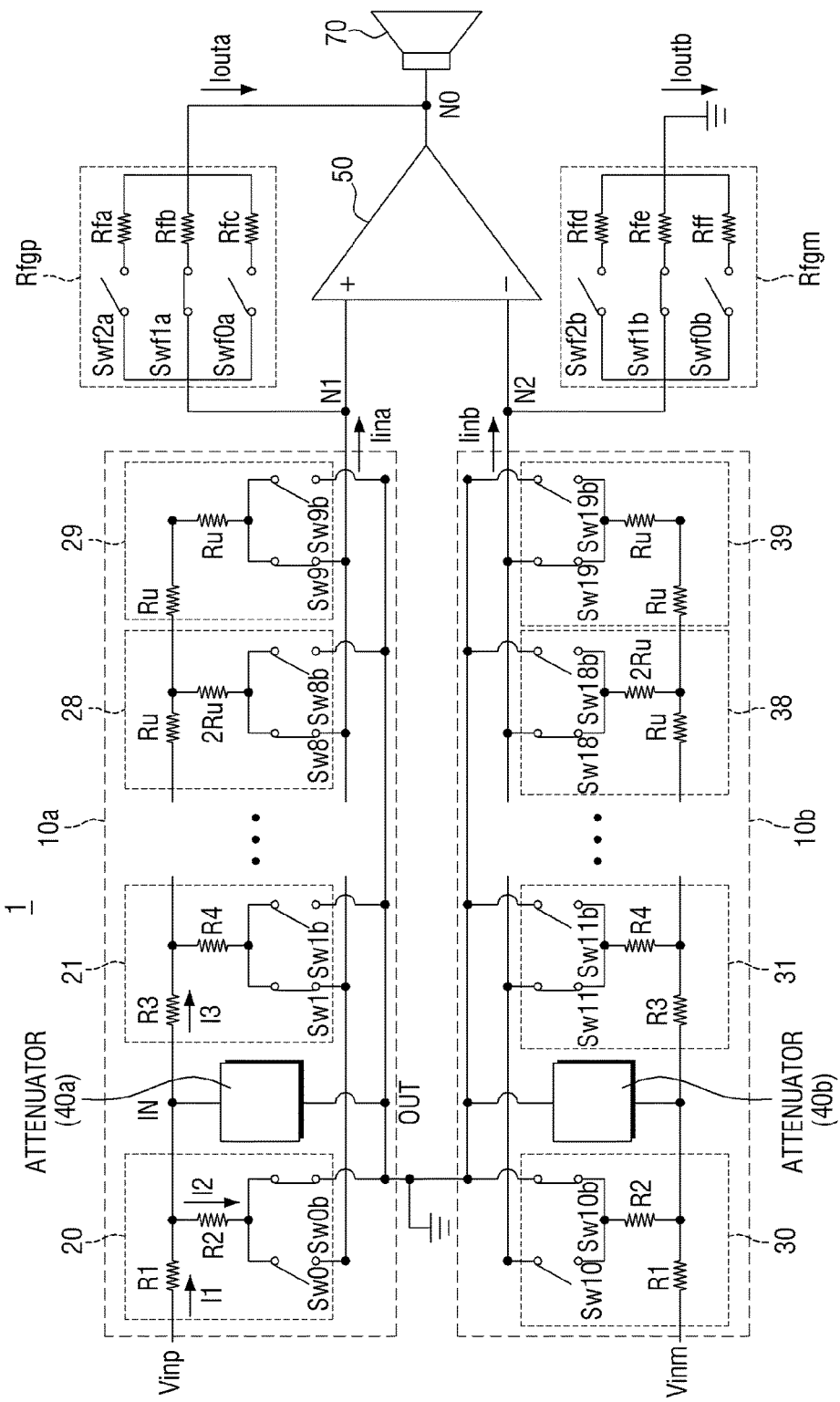

FIGS. 3A and 3B are schematic circuit diagrams of the headphone driver 1 shown in FIG. 1 with some of the switches closed and others opened for the purpose of describing the operation of the headphone driver 1. More specifically, FIGS. 3A and 3B illustrate how the headphone driver 1 operates simply through the operation of the resistor branches 20 through 39 without the operation of the first and second attenuators 40a and 40b. The expression "without the operation of the first and second attenuators 40a and 40b" means that all the internal switches (Swa0 through Swa5 of FIG. 2) of each of the first and second attenuators 40a and 40b are opened and thus the first and second attenuators 40a and 40b do not have any circuit influence on the first and second R-2R ladder networks 10a and 10b.

Referring to FIG. 3A, the resistor branches 20 through 29 are all connected to the input terminal N1 of the amplifier 50 and are disconnected from ground. Thus, a first current I1 input to the first resistor branch 20 flows to the input terminal N1 of the amplifier 50 without flowing to the ground.

The manner in which the resistance of an R-2R ladder network is computed is well known in the art to which the present disclosure pertains, and therefore a detailed discussion of the manner in which the computation is performed is omitted. An input resistance of the amplifier 50 is calculated as the second resistance 2 Ru.

The total gain of the headphone driver 1 is determined based on how the switches included in the feedback resistor group Rfgp, i.e., switches Swf0a, Swf1a, and Swf2a, are connected. In a case in which the resistances of the resistors Rfa, Rfb, and Rfc are 4 times, 2 times, and 1/20 times, respectively, greater than the first resistance Ru, as in the example of FIG. 1, gain values of the headphone driver 1 obtained when the switches Swf0a, Swf1a, and Swf2a are closed are 6 dB, 0 dB, and −32 dB, respectively.

The switches Swf0a, Swf1a, and Swf2a included in the feedback resistor group Rfgp may be alternately closed, instead of being closed at the same time. That is, once the resistance of the first R-2R ladder network 10a is determined, only one of the switches Swf0a, Swf1a, and Swf2a connected to a resistor corresponding to the determined resistance of the R-2R ladder network 10a may be closed to achieve a predefined gain value.

Thereafter, referring to FIG. 3B, the switch Sw0b of the first resistor branch 20 is connected to the ground. If the switches Sw1 through Sw9 of the second through tenth resistor branches 21 through 29, respectively, are kept connected to the input terminal N1 of the amplifier 50, the second current I2 flowing in the second resistor R2 may be ½ times greater than the first current I1 flowing in the first resistor R1. That is, since the input resistance of the amplifier 50 as viewed from an input terminal IN of the attenuator 40 is the same as the second resistance 2 Ru, a third current I3 that has the same value as the second current I2 (i.e., half the value of the first current I1) flows in the third resistor R3. Accordingly, the gain of the headphone driver 1 may be calculated as −6 dB.

Thus, in accordance with this embodiment, the headphone driver 1 achieves a gain of −6 dB simply by connecting the first resistor branch 20 to the ground. Although not specifically described in detail herein, in accordance with this exemplary embodiment, the gain of the headphone driver 1 is decreased in increments of 6 dB simply by connecting the first through tenth resistor branches 20 through 29, one after another, to ground.

As described above, the gain of the headphone driver 1 may be increased or decreased in increments of 6 dB by sequentially connecting the resistor branches 20 through 29 of the R-2R ladder network 10a or the resistor branches 30 through 39 of the R-2R ladder network 10b to ground or to the input terminal N1 or N2 of the amplifier 50.

Increasing or decreasing the volume of the audio (e.g., music) by 6 dB at the time of initiation or termination of audio driving equates to increasing or decreasing the amount of energy delivered to a user twice. This process may result in pop noise during an audio driving process, which may have an unfavorable influence on the user's audio playback experience. However, according to the present exemplary embodiment, the gain of a headphone driver 1 is increased or decreased in increments of 6 dB simply through the operation of each resistor branch included in an R-2R ladder network of the headphone driver 1, and the gain of the headphone driver 1 may be precisely controlled using the attenuator 40 included in the R-2R ladder network, thereby eliminating or at least greatly reducing pop noise.

Figure 4A:
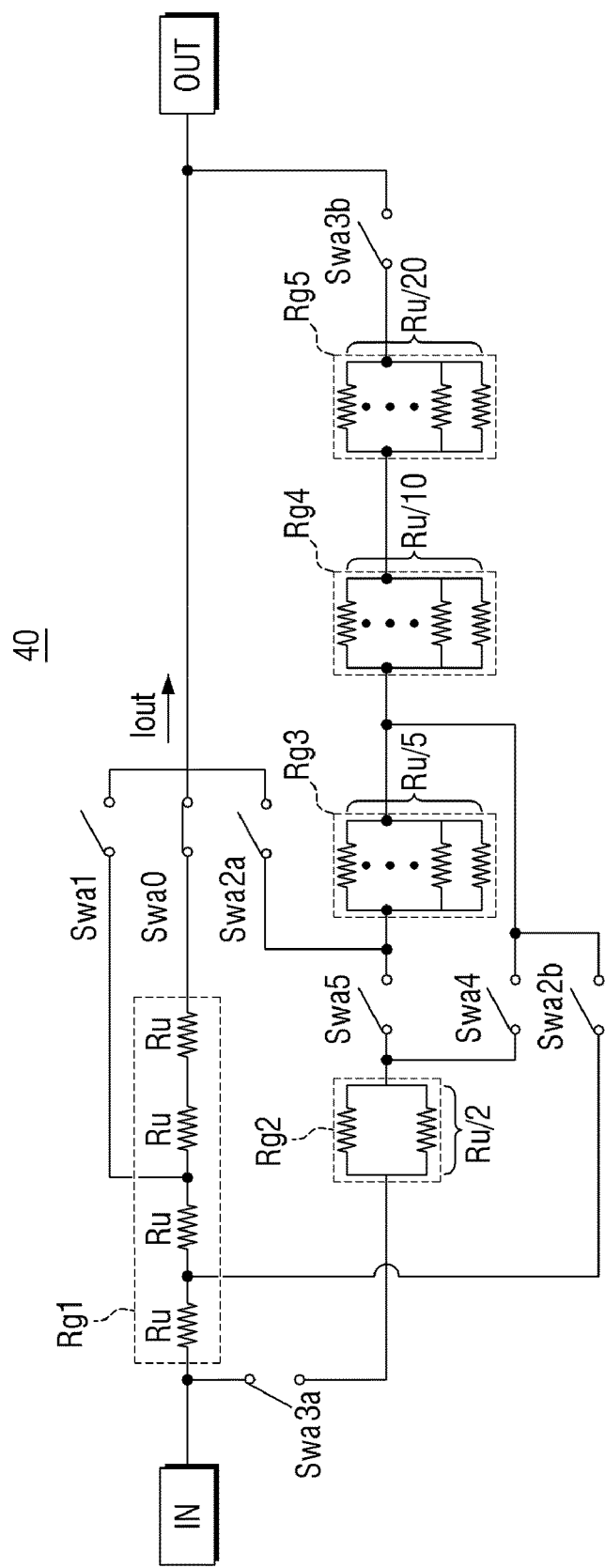
FIGS. 4A and 4B are schematic circuit diagrams for explaining the operation of the attenuator of FIG. 2.
Figure 4B:
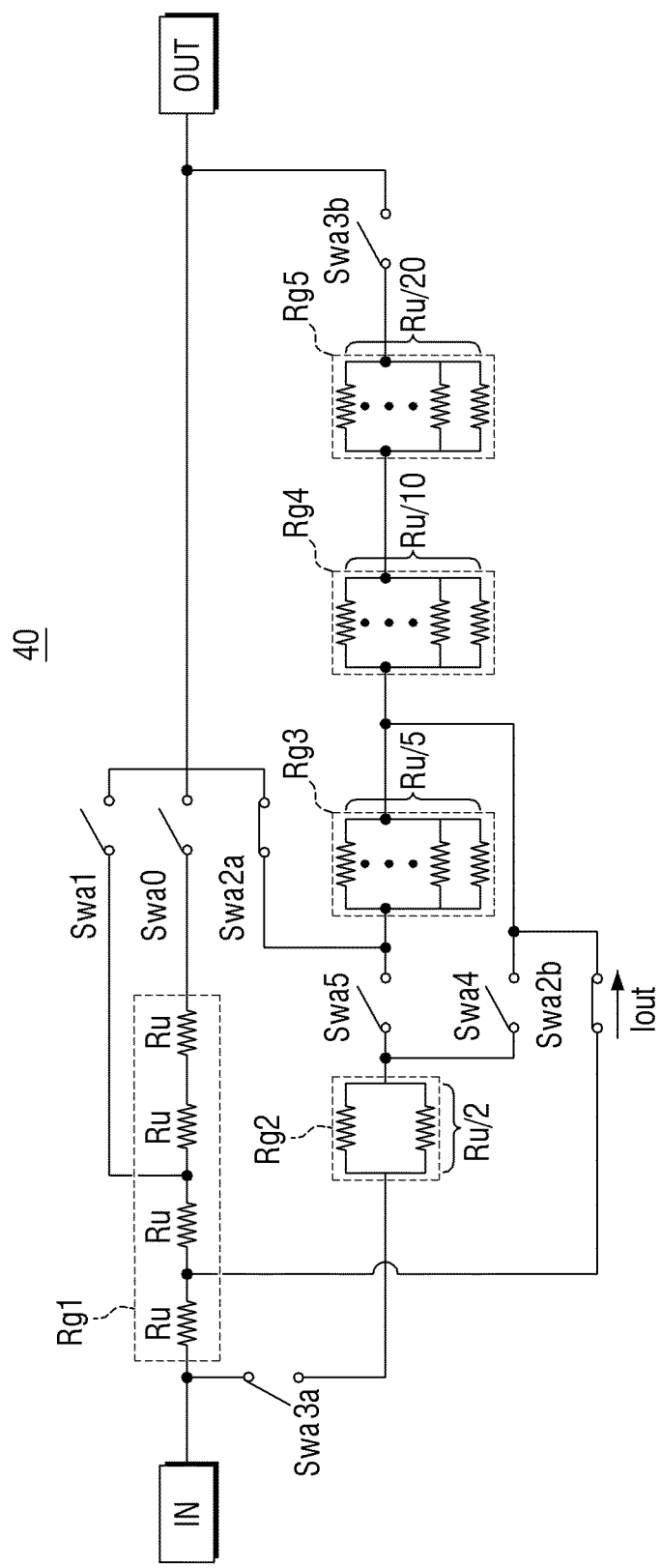

FIGS. 4A and 4B are schematic circuit diagrams of the attenuator 40 shown in FIG. 2 with different configurations of closed and opened switches for the purpose of describing the operation of the attenuator 40. For convenience, it is assumed that the operations of all the circuit elements of the headphone driver 1 except for the attenuator 40 are the same as the operations of their respective counterparts as described above with reference to FIG. 3A. Referring to FIG. 4A, all the internal switches except for the first internal switch Swa0 are opened. In this case, since only the first resistor group Rg1 is connected between the input terminal IN and an output terminal OUT of the attenuator 40, the resistance between the input terminal IN and the output terminal OUT of the attenuator 40 is four times greater than the first resistance Ru, i.e., 4 Ru.

Referring again to FIG. 3A, all of the resistor branches 20 through 29 of the first attenuator 40a are connected to the input terminal N1 of the amplifier 50, and only the first attenuator 40a having a resistance of 4 Ru is connected to ground. Only a minute portion of the first current I1 input to the first resistor branch 20 flows to ground, and the rest of the first current I1 flows to the input terminal N1 of the amplifier 50. If the resistor Rfb in the feedback resistor group Rfgp is connected as in a case in which the headphone driver 1 has a gain of 0 dB, the gain of the entire headphone driver 1 becomes −1 dB due to the first and second attenuators 40a and 40b.

On the other hand, referring to FIG. 4B, all of the internal switches except for the third internal switches Swa2a and Swa2b are opened. In response to the third switches Swa2a and Swa2b being closed, the resistance between the input terminal IN and the output terminal OUT of the attenuator 40 becomes (1+1/5)*Ru. In a case in which the resistance between the input terminal IN and the output terminal OUT of the attenuator 40 is (1+1/5)*Ru, the gain of the entire headphone driver 1 is −3 dB.

The circuit operation of the headphone driver 1 has been described in connection with the operation of the attenuator 40, taking only two cases as an example. However, although not specifically described in detail herein, the circuit operation of the headphone driver 1 will also change according to the operation of the internal switches other than the third internal switches Swa2a and Swa2b. Table 1 shows changes in the gain of the headphone driver 1 according to changes in the internal switches Swa0 through Swa5 of the attenuator 40.

TABLE 1

| Gain | Swa<5:0> | Req | Req by Ru |
|---|---|---|---|
| −1 dB | 6b'xx0001 | 4.00Ru | 4Ru |
| −2 dB | 6b'xx0010 | 2.00Ru | 2Ru |
| −3 dB | 6b'000100 | 1.20Ru | (1 + 1/5) * Ru |
| −4 dB | 6b'101000 | 0.85Ru | (1/2 + 1/5 + 1/10 + 1/20) * Ru |
| −5 dB | 6b'011000 | 0.65Ru | (1/2 + 1/10 + 1/20) * Ru |

Referring to Table 1, the "Swa<5:0>" column shows whether the internal switches Swa0 through Swa5 are opened ("1") or closed ("0"). The "Req" column shows equivalent resistances between both terminals of the attenuator 40, and the "Req by Ru" column shows the resistance values that were used to calculate the equivalent resistance values given in the "Req" column according to the parallel connection between the resistor groups Rg1 through Rg5 obtained through the arrangement of closed and opened switches Swa0 through Swa5.

As shown in Table 1, the gain of the headphone driver 1 may be controlled in increments of 1 dB according to a combination of the internal switches Swa0 through Swa5 of the attenuator 40. As described above, as the gain of the headphone driver 1 increases or decreases in increments of 6 dB, the amount of energy delivered to the user may increase or decrease about two times. On the other hand, in a case in which the attenuator 40 is used, the amount of energy delivered to the user may increase or decrease in increments of 1 dB, i.e., about 1.12 times, thereby preventing pop noise from being transmitted to the user.

Table 2 shows exemplary changes in the gain of the headphone driver 1 according to a combination of the resistor branches 20 through 29 and the attenuator 40 in the R-2R ladder network 10a.

TABLE 2

| Gain | Sw<9:0> | Swa<5:0> | Swf<2:0> |
| --- | --- | --- | --- |
| 6 dB | 10b'11111_11111 | 6b'000000 | 3b'100(=4Ru) |
| 5 dB | 10b'11111_11111 | 6b'000001(=4Ru) | 3b'100(=4Ru) |
| 0 dB | 10b'11111_11111 | 6b'000000 | 3b'010(=2Ru) |
| −2 dB | 10b'11111_11111 | 6b'000010(=2R) | 3b'010(=2Ru) |
| −7 dB | 10b'11111_11110 | 6b'000001(=4Ru) | 3b'010(=2Ru) |
| −32 dB | 10b'11111_11111 | 6b'000000 | 3b'001(=Ru/20) |
| −33 dB | 10b'11111_11111 | 6b'000001(=4Ru) | 3b'001(=Ru/20) |

If a "mute" request or a request for the termination of audio playback is received from the user, all of the switches included in the headphone driver 1 may be opened, and by doing so, a leakage current that may undesirably be generated during the "mute" operation or the termination of audio playback may be prevented.

The attenuator 40 may be combined with a plurality of resistor branches of the R-2R ladder network and may thus enable the gain of the headphone driver 1 to be precisely controlled. Since the attenuator 40 is connected in parallel between a plurality of resistor branches in an R-2R ladder network, the input resistance of the headphone driver 1 is independent of the gain of the headphone driver 1, but is dependent upon the operation of the switches of the resistor branches and the attenuator 40 of the headphone driver 1. Accordingly, the influence of the nonlinearity of each element of the headphone driver 1 on the entire system becomes insignificant, and the operational reliability of the headphone driver 1 is improved.

The attenuator 40 may be configured with a combination of a plurality of identical resistors having the same resistance (i.e., the first resistance Ru) and multiple switches connecting the identical resistors. Accordingly, gain imbalance and the degradation of the reliability of the headphone driver 1 that may be caused by mismatches between resistors of various sizes may be prevented.

Figure 5:
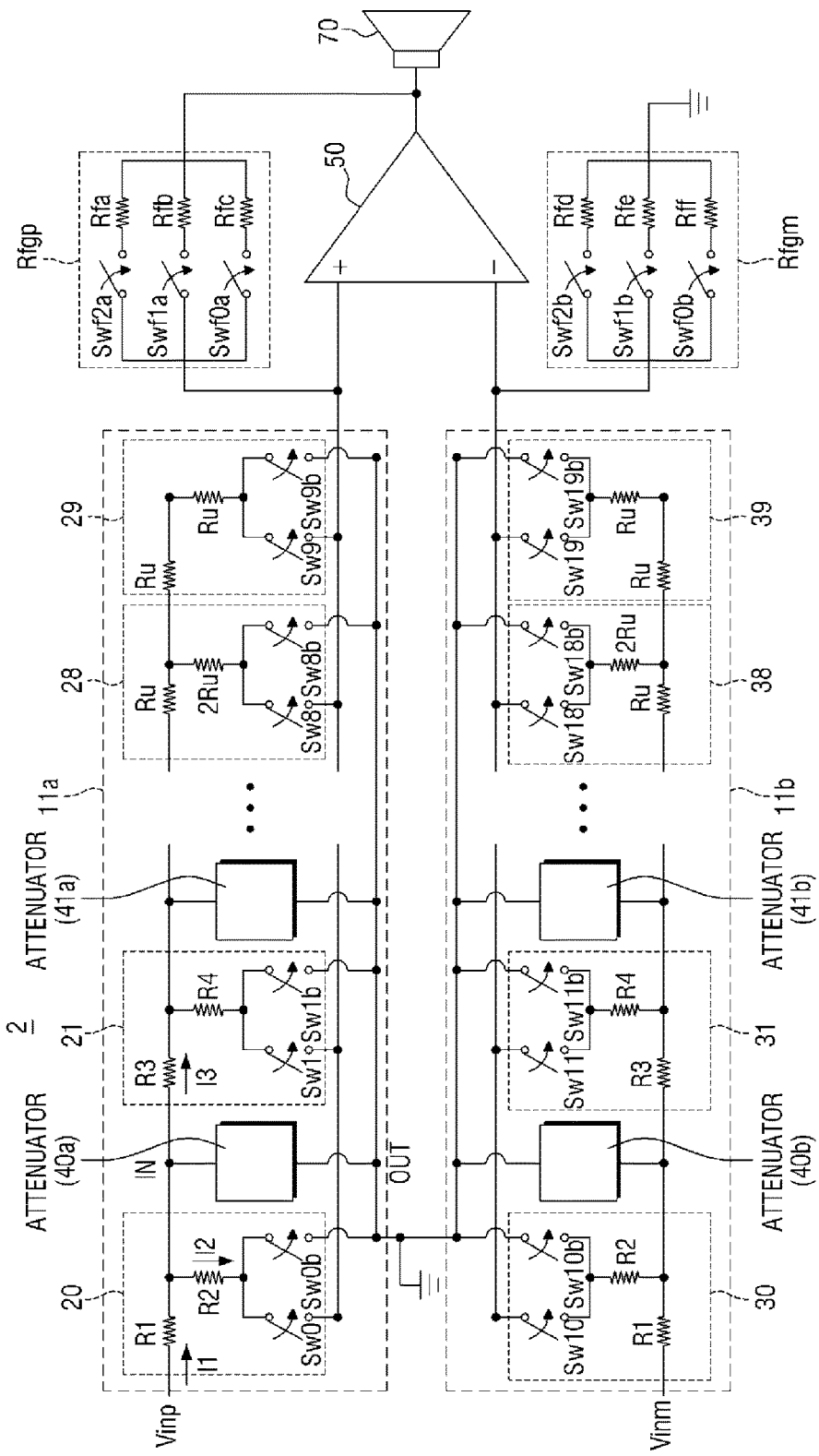
FIG. 5 is a schematic circuit diagram of a headphone driver according to another exemplary embodiment of the present disclosure.

FIG. 5 is a schematic circuit diagram of a headphone driver 2 according to another exemplary embodiment. The headphone driver 2 according to this exemplary embodiment will be described, focusing mainly on differences between the headphone driver 2 and the headphone driver 1 described above.

Referring to FIG. 5, the headphone driver 2 has an R-2R ladder network structure that is different from the R-2R ladder network structure of the headphone driver 1. The R-2R ladder network 11a of the headphone driver 2 includes a first attenuator 40a and a second attenuator 41a. The second attenuator 41a may be connected in parallel between a second resistor branch 21 and a third resistor branch (not shown).

In the headphone driver 1 according to the previous exemplary embodiment, the first attenuator 40a is connected in parallel between the resistor branches 20 through 29 to control the gain of the headphone driver 1 in increments of 1 dB.

The second attenuator 41a enables further precision, or granularity, in controlling the gain of the headphone driver 2 to be achieved in that the second attenuator 41a allows the gain of the headphone driver 2 to be controlled in increments of less than 1 dB.

The second attenuator 41a is illustrated as being connected in parallel between the second resistor branch 21 and the third resistor branch, but the present disclosure is not limited to this arrangement. That is, the locations of all the attenuators included in the headphone driver 2, except for the location of the first attenuator 40a, which is connected in parallel between a first resistor branch 20 and the second resistor branch 21, may vary. In accordance with this exemplary embodiment, three or more attenuators are included in the headphone driver 2.

Figure 6:
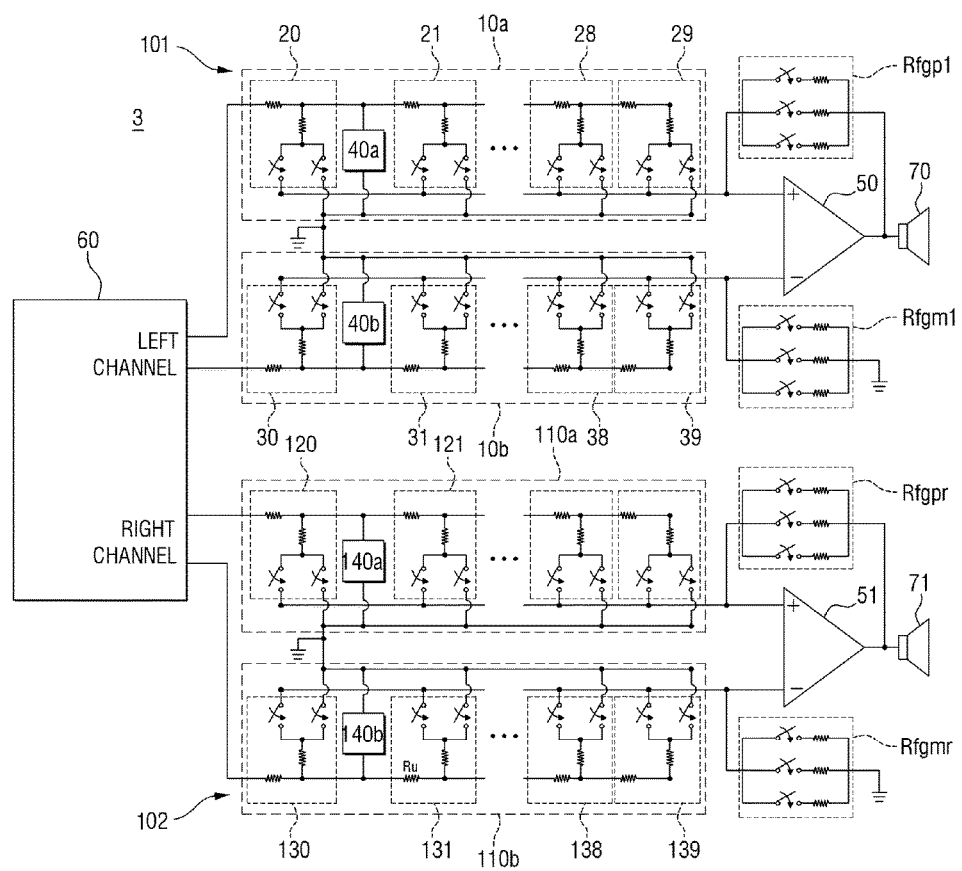
FIGS. 6 and 7 are schematic circuit diagrams of headphone drivers according to other exemplary embodiments of the present disclosure.

FIG. 6 is a schematic circuit diagram of a headphone driver 3 according to another exemplary embodiment. Referring to FIG. 6, the headphone driver 3 includes a left-channel driver 101, a right-channel driver 102, and a digital-to-analog converter (DAC) 60. The DAC 60 converts digital signals into analog signals and provides the analog signals to the left- and right-channel drivers 101 and 102. In some exemplary embodiments, the analog signals provided by the DAC 60 may be stereo signals. That is, the analog signals provided by the DAC 60 may include a left-channel signal and a right-channel signal. The left-hand channel driver 101 has first and second driver channels that provide respective drive signals to the first and second R-2R ladder networks 10a and 10b, respectively. The right-hand channel driver 101 has first and second driver channels that provide respective drive signals to third and fourth R-2R ladder networks 110a and 110b, respectively, that are identical to the first and second R-2R ladder networks 10a and 10b, respectively. The first and second R-2R ladder networks 10a and 10b, respectively, have attenuators 40a and 40b, respectively, that are identical to the attenuator 40 shown in FIG. 4A. The third and fourth R-2R ladder networks 110a and 110b, respectively, have attenuators 140a and 140b, respectively, that are identical to the attenuator 40 shown in FIG. 4A. The components 120-139 of the networks 110a and 110b are identical to the components 20-39, respectively, of the networks 10a and 10b, respectively.

The left-channel driver 101 receives the left-channel signal from the DAC 60, amplifies the received signal, and outputs the amplified signal to a left-channel output port 70. The right-channel driver 102 receives the right-channel signal from the DAC 60, amplifies the received signal, and outputs the amplified signal to a right-channel output port 71. The left- and right-channel drivers 101 and 102 receive different signals from the DAC 60 but may have the same structure. However, the gains of the left- and right-channel drivers 101 and 102 may be controlled differently.

Figure 7:
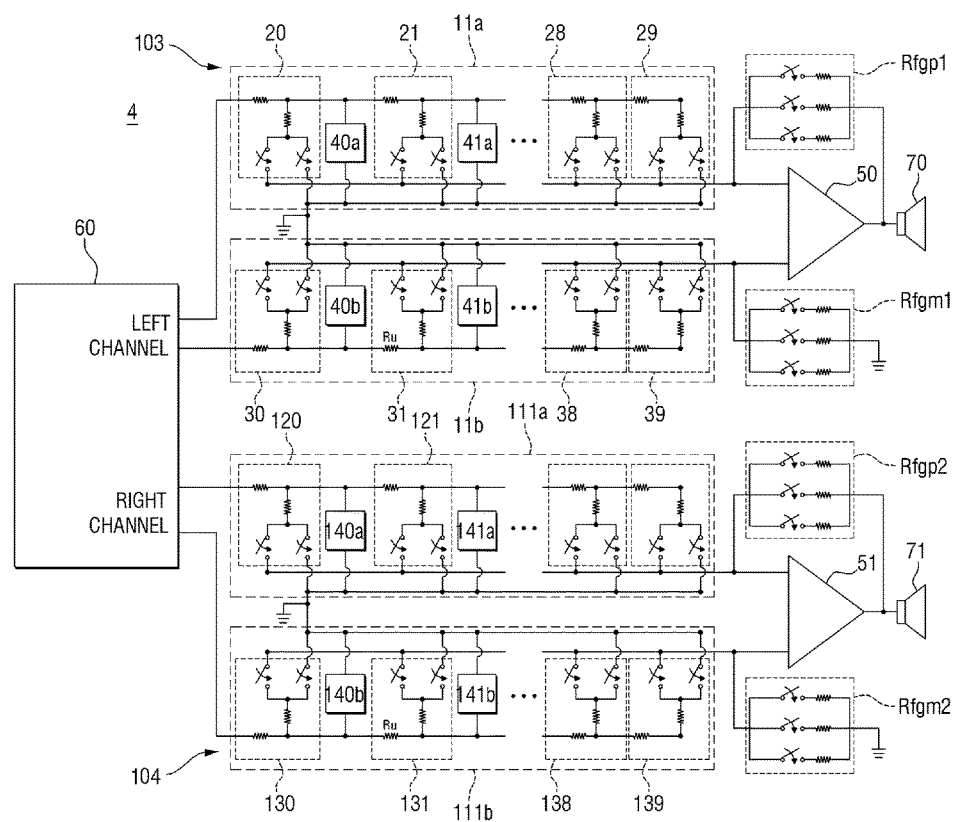

FIG. 7 is a schematic circuit diagram of a headphone driver according to another exemplary embodiment of the present disclosure. Referring to FIG. 7, each of a left-channel driver 103 and a right-channel driver 104 may include more than one pair of attenuators. In accordance with this exemplary embodiment, the left-hand driver 103 has a first pair of attenuators 40a and 40b and a second pair of attenuators 41a and 41b. Likewise, the right-hand driver 104 has a third pair of attenuators 140a and 140b and a fourth pair of attenuators 141a and 141b that are identical to the first pair of attenuators 40a and 40b and the second pair of attenuators 41a and 41b, respectively. Since each of the left- and right-channel drivers 103 and 104 includes more than one pair of attenuators, the gain of each of the left- and right-channel drivers 103 and 104 may be precisely controlled in increments of 1 dB or less.

Figure 8:
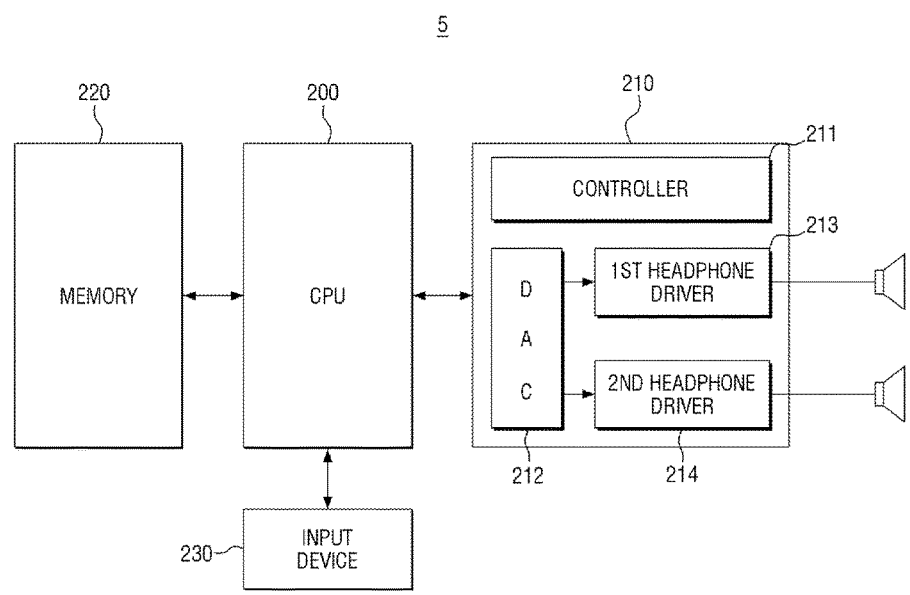
FIG. 8 is a schematic block diagram of a computing system including a sound processor according to an exemplary embodiment of the present disclosure.

FIG. 8 is a schematic block diagram of a computing system 5 comprising a central processing unit (CPU) 200, a sound processor 210, a memory 220, and an input device 230. The CPU 200 performs computation necessary for driving the computing system 5. In some embodiments, the CPU 200 is configured as a multi-core environment comprising a plurality of processing cores. The CPU 200 may include a memory controller (not shown) configured to control the memory 220.

In accordance with this embodiment, the sound processor 210 includes a controller 211, a DAC 212, a first headphone driver 213, and a second headphone driver 214. The first and second headphone drivers 213 and 214 may have the same configuration as any one of the headphone drivers 1 and 2. The controller 211 applies control signals to open or close the switches of the headphone drivers 213 and 214 in the manner described above to control the gains of the first and second headphone drivers 213 and 214. The controller 211 may provide different control signals to the first and second headphone drivers 213 and 214 so that the drivers 213 and 214 have different gains.

The input device 230 may be, for example, a touch pad, a volume key or some other type of suitable input device for receiving input from a user.

In the computing system 5, audio playback can be controlled according to the user input received by the input device 230. Examples of the user input received by the input device 230 may include, for example, "play", "stop", and "mute" selections. The CPU 200 is configured to receive commands from the input device 230 and to convert the commands into commands that can be processed by the controller 211. The controller 211 receives the commands from the CPU 200 and converts the commands into digital control signals, which are then converted into analog control signals by the DAC 212 and delivered to the first and second headphone drivers 213 and 214, respectively, for controlling the gain of the first and second headphone drivers 213 and 214 based on the user input received via the input device 230. The control signals provided by the controller 211 to the first and second headphone drivers 213 and 214 may be different from one another.

The input device 230 may interface directly with the sound processor 210, in which case the controller 211 will convert commands received from the input device 230 into digital control signals, which are then converted by the DAC 212 into the analog control signals that are used by the first and second headphone drivers 213 and 214 to control the gain settings of the first and second headphone drivers 213 and 214. In the latter case, the CPU 200 and the memory 220 may be omitted. In other words, the controller 211 may operate as the CPU of the computing system 5, in which case the CPU 200 is not needed.

The operations of the CPU 200 and the controller 211 are controlled by software and/or firmware executed by the CPU 200 and the controller 211. Software executed by the CPU 200 is typically stored in memory 220, which is any suitable non-transitory computer-readable medium, such as a solid state memory device. The CPU 200 may also have on-board memory for this purpose. Software or firmware executed by the controller 211 is typically stored in an on-board memory device (not shown) of the controller 211. Whatever type of memory device that is used for storing the software and/or firmware will be a non-transitory computer-readable medium, such as a solid state memory device, e.g., read only memory (ROM), erasable programmable ROM (EPROM), flash memory, etc.

Figure 9:
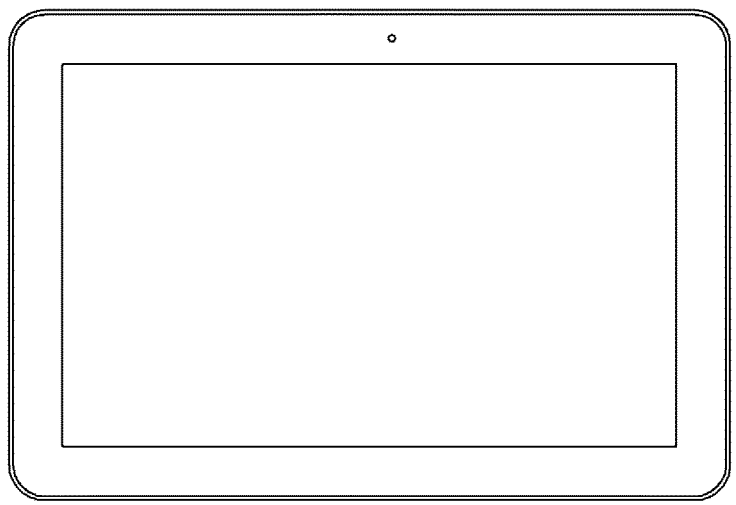
FIGS. 9 through 11 are schematic views illustrating exemplary semiconductor systems to which a semiconductor device using a headphone and a sound processor including the headphone according to exemplary embodiments of the present disclosure is applicable.
Figure 10:
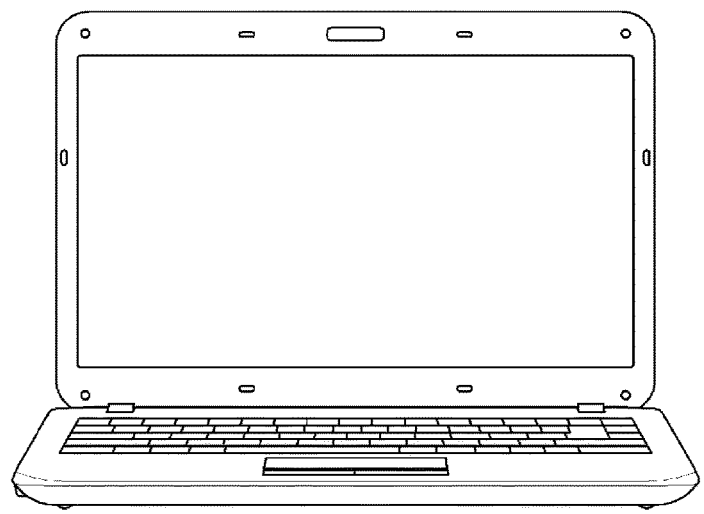
Figure 11:
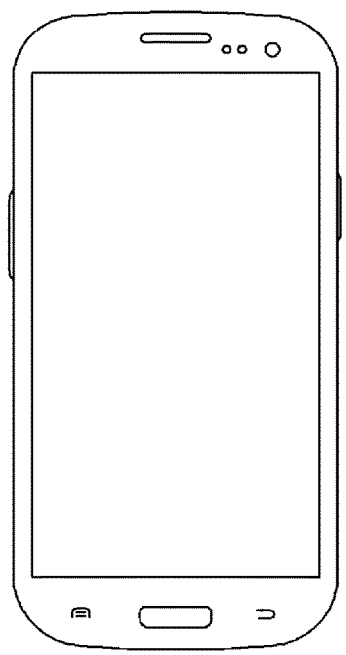

FIGS. 9 through 11 are schematic views illustrating exemplary semiconductor systems that may incorporate semiconductor devices in which the headphone drivers 1-4 or the computing system 5 are integrated.

More specifically, FIG. 9 illustrates a tablet PC 1200, FIG. 10 illustrates a notebook computer 1300, and FIG. 11 illustrates a smartphone 1400, all of which are suitable for use with semiconductor devices having the headphone drivers 1-4 or the computing system 5 integrated thereon. In other words, such semiconductor devices may be used in the tablet PC 1200, the notebook computer 1300, and the smartphone 1400, although they may be used in a variety of other systems.

Although the semiconductor systems have been described with reference to the tablet PC 1200, the notebook computer 1300, and the smartphone 1400 for exemplary purposes, the inventive concepts are not limited thereto.

In some exemplary embodiments, the semiconductor system may be, for example, a computer, an Ultra Mobile PC (UMPC), a work station, a net-book computer, a personal digital assistant (PDA), a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, or a digital video player.

The exemplary embodiments of the present disclosure have been described herein for the purpose of demonstrating the inventive principles and concepts. However, as will be appreciated by those skilled in the art, many variations and modifications can be made to the disclosed embodiments without departing from the principles and concepts. All such variations or modifications are within the scope of the present disclosure.

What is claimed is:
1. A headphone driver, comprising:
an amplifier including at least a first input terminal and an output terminal;
an R-2R ladder network provided with an input signal and connected to the input terminal of the amplifier, the R-2R ladder network comprising a plurality of interconnected resistor branches, each of the plurality of interconnected resistor branches comprising a pair of first and second resistors;
a feedback resistor group connected to the first input terminal and to the output terminal of the amplifier; and
at least a first attenuator connected between first and second resistor branches from among the plurality of interconnected resistor branches,
wherein the first attenuator includes an input node, an output node, a first resistor group, and a second resistor group,
the first resistor group includes a first plurality of resistors each having a first resistance and connected in series, and the second resistor group includes a second plurality of resistors each having the first resistance and connected in parallel, and wherein at least one of the first and second resistor groups is connectable to the output node according to control signals.

2. The headphone driver of claim 1, wherein a first current flows in the first resistor of each of the plurality of interconnected resistor branches, and wherein a second current that is part of the first current flows in the second resistor of each of the plurality of interconnected resistor branches and is output to one of the first input terminal of the amplifier and a ground in response to the control signals received by the headphone driver.

3. The headphone driver of claim 2, wherein each of the plurality of interconnected resistor branches further includes a switch, wherein the switch in a corresponding one of the plurality of interconnected resistor branches is connected to the second resistor in the corresponding one of the plurality of interconnected resistor branches and is configured to connect the second resistor in the corresponding one of the plurality of interconnected resistor branches to one of the first input terminal of the amplifier and to the ground in response to the control signals.

4. The headphone driver of claim 2, wherein the second resistor in a corresponding one of the plurality of interconnected resistor branches has a resistance value that is twice a resistance value of the first resistor in the corresponding one of the plurality of interconnected resistor branches.

5. The headphone driver of claim 2, further comprising a controller configured to provide the control signals.

6. The headphone driver of claim 1, wherein the input signal is provided to the first resistor branch and the first attenuator is connected in parallel between the first and second resistor branches.

7. The headphone driver of claim 6, further comprising a second attenuator connected in parallel between the second resistor branch and a third resistor branch from among the plurality of interconnected resistor branches.

8. The headphone driver of claim 1, wherein a combined resistance of the second plurality of resistors of the second resistor group is at least one of ½ times, ⅕ times, 1/10 times, and 1/20 times greater than the first resistance.

9. The headphone driver of claim 1, wherein the control signals comprise first and second control signals, and wherein the first attenuator further includes a first switch configured to connect the first resistor group to the output node according to the first control signal, and a second switch configured to connect the second resistor group to the output node according to the second control signal.

10. The headphone driver of claim 1, wherein the feedback resistor group includes at least first and second feedback resistors and first and second feedback switches, the first feedback resistor connected to the first feedback switch and the second feedback resistor connected to the second feedback switch.

11. A sound processor comprising:
a digital-to-analog converter (DAC) that receives digital control signals, converts the digital control signals into analog control signals, and outputs the analog control signals;
a headphone driver including an amplifier, an R-2R ladder network and a feedback resistor group, the amplifier having at least a first input terminal and an output terminal, the R-2R ladder network connected to the first input terminal of the amplifier, the feedback resistor group connected to the first input terminal and to the output terminal of the amplifier, and wherein the R-2R ladder network includes a first resistor branch that receives an analog input signal output from the DAC and outputs a first current, a second resistor branch connected to the first resistor branch, and a first attenuator connected in parallel between the first and second resistor branches and the first current, wherein the first attenuator outputs part of the first current to a ground in response to the analog control signals received by the headphone driver from the DAC; and a controller that receives commands responsive to user input, and outputs the digital control signals to the DAC responsive to the received commands.

12. The sound processor of claim 11, wherein the analog control signals include a left-channel signal and a right-channel signal, and wherein the headphone driver includes a first driver that is provided with the left-channel signal and a second driver that is provided with the right-channel signal.

13. The sound processor of claim 11, wherein in response to a received command from among the received commands comprising a mute command, the controller provides the digital control signals to open one or more electrical connections in the first and second resistor branches and in the first attenuator.

14. A computing system comprising:
a central processing unit (CPU); and
an input device in communication with the CPU, the input device configured to receive input from a user of the computing system and to convert the received input into commands for processing by the CPU, wherein the CPU receives the commands and outputs converted commands according to the received commands; and
a sound processor in communication with the CPU, the sound processor comprising
a controller that receives the converted commands and outputs digital control signals responsive to the received converted commands,
a digital-to-analog converter (DAC) that receives the digital control signals and converts the received digital control signals into analog control signals that are output from the DAC, and
a headphone driver including an amplifier, an R-2R ladder network and a feedback resistor group, the amplifier having at least a first input terminal and an output terminal, the R-2R ladder network connected to the first input terminal of the amplifier, the feedback resistor group connected to the first input terminal and to the output terminal of the amplifier, and
wherein the R-2R ladder network includes a first resistor branch that receives an analog input signal output from the DAC and outputs a first current, a second resistor branch connected to the first resistor branch, and a first attenuator connected in parallel between the first and second resistor branches and the first current, wherein the first attenuator outputs part of the first current to a ground in response to the analog control signals received by the headphone driver from the DAC.

15. The computing system of claim 14, wherein the analog control signals include a left-channel signal and a right-channel signal, and wherein the headphone driver includes a first driver that is provided with the left-channel signal and a second driver that is provided with the right-channel signal.

16. The computing system of claim 14, wherein in response to a converted command from among the received converted commands being a mute command, the controller provides the digital control signals to open one or more electrical connections in the first and second resistor branches and in the attenuator.

17. The computing system of claim 14, wherein each of the first and second resistor branches include a pair of first and second resistors and a switch connected to the second resistor, the switch connecting the second resistor to one of the first input terminal of the amplifier and to the ground in response to the analog control signals received by the headphone driver from the DAC.

\* \* \* \* \*